United States Patent
Bergmann et al.

(10) Patent No.: US 7,525,809 B2
(45) Date of Patent: Apr. 28, 2009

(54) ISOLATED CONTROL AND NETWORK WIREWAY FOR MOTOR CONTROL CENTER

(75) Inventors: Herberto Bergmann, São Paulo (BR); Arnaldo Hiroyuki Omoto, São Paulo (BR); Luis Ricardo Luzardo Pereira, São Paulo (BR); José Batista Ferreira Neto, São Paulo (BR); David L. Jensen, Barneveld, WI (US); Chester Malkowski, Jr., Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 530 days.

(21) Appl. No.: 11/271,714

(22) Filed: Nov. 11, 2005

(65) Prior Publication Data

US 2006/0063434 A1    Mar. 23, 2006

Related U.S. Application Data

(63) Continuation-in-part of application No. 10/675,308, filed on Sep. 30, 2003, now Pat. No. 7,063,572.

(51) Int. Cl.
*H05K 5/00* (2006.01)

(52) U.S. Cl. .................. 361/752; 361/800; 361/790

(58) Field of Classification Search .............. 361/752, 361/790, 797, 800; 312/223
See application file for complete search history.

(56) References Cited

U.S. PATENT DOCUMENTS

| | | | |
|---|---|---|---|
| 3,586,915 A * | 6/1971 | Urquhart et al. ............ 361/697 |
| 3,626,253 A | 12/1971 | Sturdivan | |
| 4,121,276 A * | 10/1978 | Kovatch et al. ............. 361/614 |
| 4,733,389 A * | 3/1988 | Puvogel ...................... 370/200 |
| 5,295,041 A * | 3/1994 | Metivier et al. ............. 361/622 |
| 5,905,631 A * | 5/1999 | Winkler ...................... 361/641 |

FOREIGN PATENT DOCUMENTS

| | | | |
|---|---|---|---|
| DE | 9204389 U1 | 7/1993 |
| DE | 4313653 A1 | 10/1994 |
| NL | 9201293 A | 2/1994 |

\* cited by examiner

*Primary Examiner*—Hung S Bui
(74) *Attorney, Agent, or Firm*—Fletcher Yoder Law; Alexander R. Kuszewski

(57) ABSTRACT

A packaged electrical system includes an enclosure and a main interior volume for component supports. The component supports may support electrical, electronic, power electronic and similar components, as well as switchgear and the like. A main power wireway is provided adjacent to the main interior volume of the enclosure for accommodating three phase power conductors. A network and control power wireway is formed separately from the main power wireway. The network and control power wireway may be formed toward the rear of the main interior volume, and may accommodate plug-in connections between component supports and network conductors and control power conductors. The network and control power wireway is thus accessible through a separate door from the main power wireway.

20 Claims, 7 Drawing Sheets

ISOLATED CONTROL AND NETWORK WIREWAY FOR MOTOR CONTROL CENTER

CROSS REFERENCE TO RELATED APPLICATIONS

This application is a Continuation-In-Part of U.S. patent application Ser. No. 10/675,308, entitled "METHOD AND APPARATUS FOR ELECTRICAL COMPONENT CONNECTIVITY", filed Sep. 30, 2003 now U.S. Pat. No. 7,063,572, which is herein incorporated by reference.

BACKGROUND

The present invention relates generally to packaged electrical systems, and particularly to a technique for providing network signals and control power, separately from main power in such systems.

A wide range of applications exist for packaged electrical systems, in settings from industry, to commercial applications and marine applications. In many such environments, electronic components, such as programmable logic controllers are packaged with power electronic components, such as motor drives, inverters, and so forth. The systems may further include input/output monitoring circuits, network interfaces, and the like. Most systems also include various types of protective circuitry, such as fuses and circuit breakers, along with switchgear, such as relays and contactors. These various components typically require network data exchange capabilities, along with control power supplies, such as for operation of the electric mechanical devices such as the relays and contactors. Main power is also provided, typically three phase alternating current power, that is ultimately provided to loads, such as motors.

In conventional packaged electrical systems of the type described above, the components are arranged in one or more enclosures. The enclosures may be subdivided into compartments for associated circuit components. A wireway is typically provided on a side of the enclosure or the enclosure compartments that serves to route all power, network, and other conductors to the various compartments and components within the compartments.

There is a need, however, for improved packaged systems that provide network signals, control power and main power to enclosed components. There is a particular need, for example, for systems that will enable separation of power levels so as to allow for servicing of the components and lower power-level conductors without accessing the main power conductors. Such arrangements are also needed that provide for hard-wiring of main power and plug-in connection of network conductors and control power conductors in a straightforward manner.

BRIEF DESCRIPTION

The present invention provides a motor control center as an exemplary packaged electrical system designed to respond to such needs. The motor control center (MCC) generally includes an enclosure for housing a plurality of electrical power component supports. A network and control power wireway is configured to house conductors for a network link, as well as conductors for control power from a power source. A power wireway is also provided within the enclosure and separated from the network and control power wireway for housing three phase power conductors.

In one exemplary arrangement, the network and control power wireway is disposed within a main interior volume of the enclosure. The main interior volume is accessible via at least one main door. The power wireway is formed within the enclosure adjacent to the main interior volume. The power wireway is accessible via a separate door, and is again separated from the network and control power wireway for routing of the three phase power conductors.

The system may include prewired connector assemblies disposed over the network and power wireway. These connector assemblies can provide for plug-in engagement of component supports within the enclosure without accessing the power wireway.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
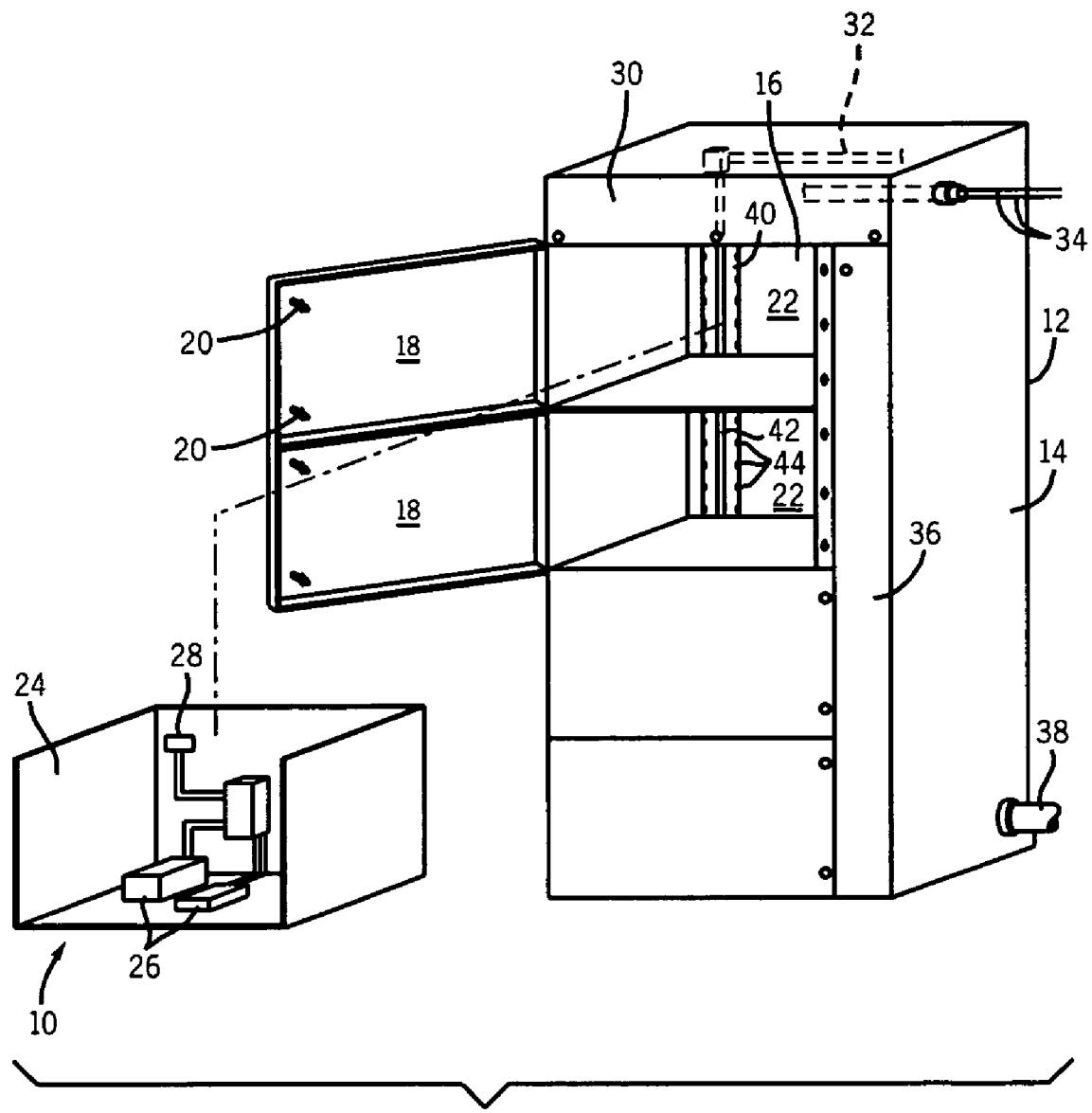
FIG. 1 is a perspective view of an exemplary packaged electrical system, such as an MCC, incorporating a connector arrangement in accordance with aspects of the invention.

Turning now to the drawings, and referring first to FIG. 1, a packaged electrical system 10 is illustrated as including an enclosure 12 that houses various electrical components. The enclosure will typically be formed of heavy gage sheet metal, although other enclosures, such as made of reinforced plastic may sometimes be used. The enclosure generally forms a shell 14 having a main interior volume 16 in which components and component supports are placed. The interior volume 16 may be subdivided into compartments that each receive particular components, typically components interconnected to form a portion of the overall process control or monitoring system. Each compartment may be accessed through main doors 18. Latches 20 are provided to hold the doors closed over the interior volume during operation.

Within each of the compartments, designated generally by reference numeral 22 in FIG. 1, component supports 24 may be disposed. As will be appreciated by those skilled in the art, the component supports 24 may be configured in various standard sizes or heights, and will typically comprise a metal drawer that can be slid into a compartment designed to accommodate the particular component support. On or within the component supports 24, a variety of components 26 are supported and interconnected. As noted above, such components may include electronic devices, such as programmable logic controllers, power electronic devices, such as motor controllers, inverter drives, and so forth, as well as switchgear, input/output interfaces, protective circuit components, and so forth. The components are generally designed to perform some control or monitoring function within an overall machine system. Accordingly, data signals are exchanged with the components and remote control and monitoring equipment or computers (not shown). Power signals are also provided to the components, as described in greater detail below, for enabling energization of such components such as relays, contactors, and so forth. Similarly, three phase power is typically provided to those components which will provide power to driven loads. Such loads may include motors, actuators, valves, and any other electrical load that may be present in the controlled or monitored process.

Within each component support 24, a component connector assembly 28 is supported. In the illustrated embodiment, the component connector assembly 28 is disposed on a rear wall of the support. As will be appreciated by those skilled in the art, such component connector assemblies may be provided on any suitable surface or support of the component support, such as a side panel, a lower or upper corner, and so forth. As described in greater detail below, the component connector assembly 28 will mate with a prewired connector assembly within the enclosure to provide network signals and control power to the components within the component support.

The enclosure 12 is particularly configured to pass network signals and control power through routing pads separated from other paths for main or three phase power. In the embodiment illustrated in FIG. 1, for example, an upper wireway or section 30 of the enclosure accommodates a network trunk cable 32 as well as conductors or cabling for control power, as indicated by reference numeral 34. The network trunk cable may be a shielded or flat media cable or any other suitable cable that is capable of transmitting data signals between the components and remote circuitry in accordance with standard network protocols. An exemplary protocol for MCCs, for example, is the DeviceNet protocol. The control power supplied by conductors 34 may be provided at various levels, depending upon the application. The conductors may be particularly configured, for example, to carry 110, 115, 220 or 230 volt, single phase power, 24 volt direct current power, 24 volt single phase power, and so forth.

A separate wireway 36 is provided in the enclosure for routing three phase power. In many applications, such power will be rated at 460 volt three phase, and may be provided in either three-wire configurations or four-wire configurations (including a neutral conductor). Such wiring will be routed through a main conduit 38 and connected within the backplane of the enclosure to main bus bars that are engaged by the component supports by conventional stab connections (not shown).

The embodiment shown in FIG. 1 provides a separate network and control power wireway 40 isolated from the main power wireway 36. Because of the lower power levels that would typically be present in the network conductor 32 and control power conductors 34, it has been found desirable to separate these wireways for initial installation and subsequent servicing needs. Accordingly, a network cable 42 is provided in the network and control power wireway 40, and is electrically coupled to conductors within the trunk cable assembly 32. Similar drop conductors (not shown) are provided for conductors coupled to the control power conductors 34. Where multiple sections or bays are provided in the system, the network trunk cable assembly 32 and the control power conductors 34 may continue through similar wireways to such additional bays or enclosures. Tabs 44 are provided in the network and control power wireway 40 for accommodating prewired connector assemblies that mate with connector assembly 28 as described in greater detail below.

Figure 2:
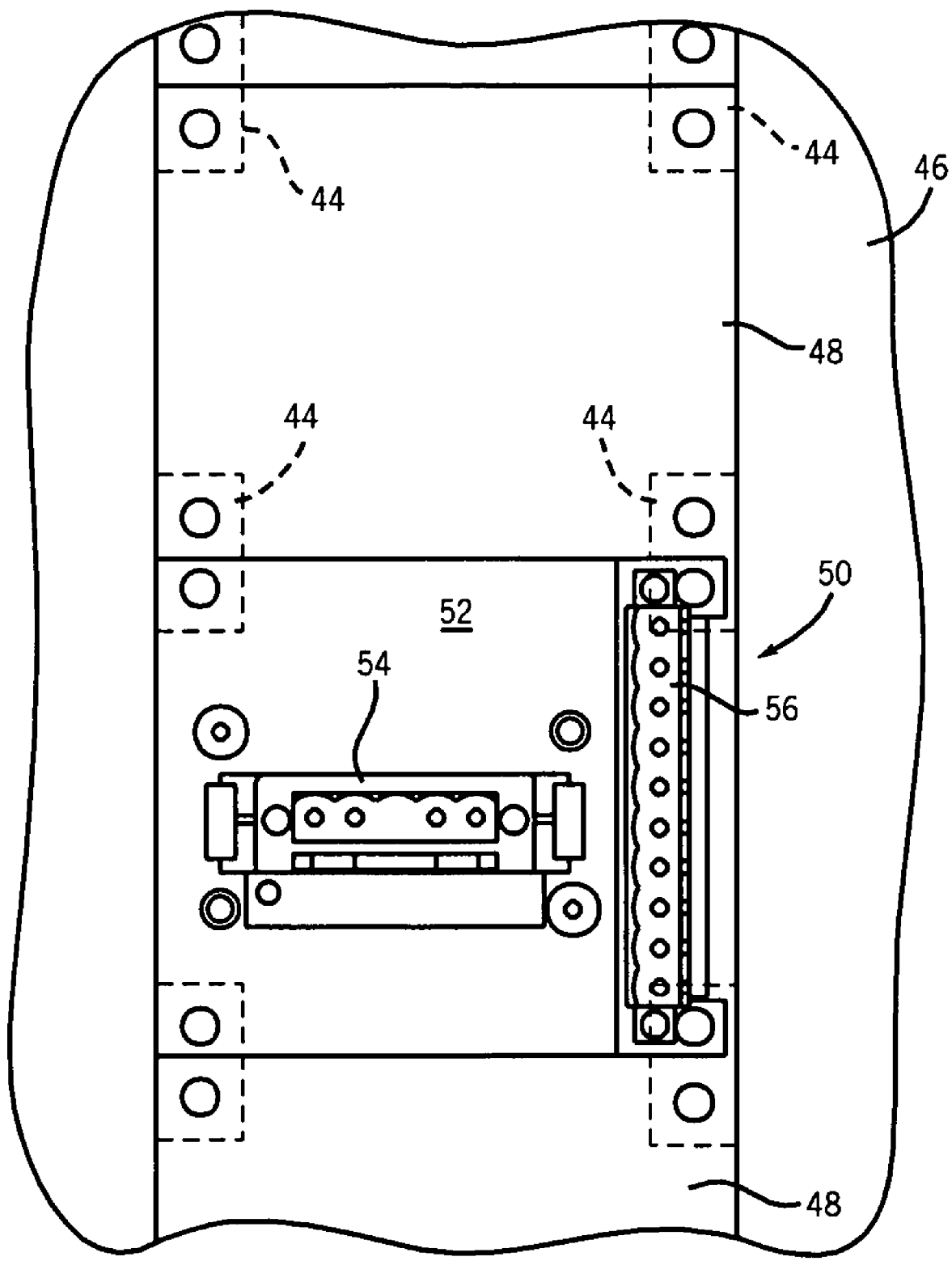
FIG. 2 is a detailed view of the prewired connector assembly installed in the enclosure of FIG. 1.

FIG. 2 represents a detailed view of the rear wall of the enclosure of FIG. 1, showing the network and control wireway formed in a rear panel 46 of the enclosure. As shown in FIG. 2, the wireway may be at least partially covered by blind plates 48 that enclose the wireway and are secured in place via appropriate fasteners to tabs 44. At the location of a component connector assembly 28 of a component support (see, FIG. 1), a prewired connector assembly 50 will be provided and similarly secured to the tabs of the wireway. Each prewired connector assembly generally includes a plate 52 on or through which a mating network connector 54 and a control power connector 56 are mounted. Connectors 54 and 56 may be of any suitable type or design. In the illustrated embodiment, the mating network connector 54 includes an orientation-sensitive receptacle having four conductors, two for data signals and two for network power. The mating control power connector 56 is also a commercially available connector including multiple conductors in an orientation-sensitive body for conveying the appropriate level of control power (e.g., 110 or 115 volt single phase power, 24 volt direct current power, and so forth). The plate 52 also supports one or more alignment devices, such as alignment pins 58 in the illustrated embodiment. These alignment devices aid in aligning the mating connectors 54 and 56 with similar connectors of the component connector assembly as described in greater detail below.

Figure 3:
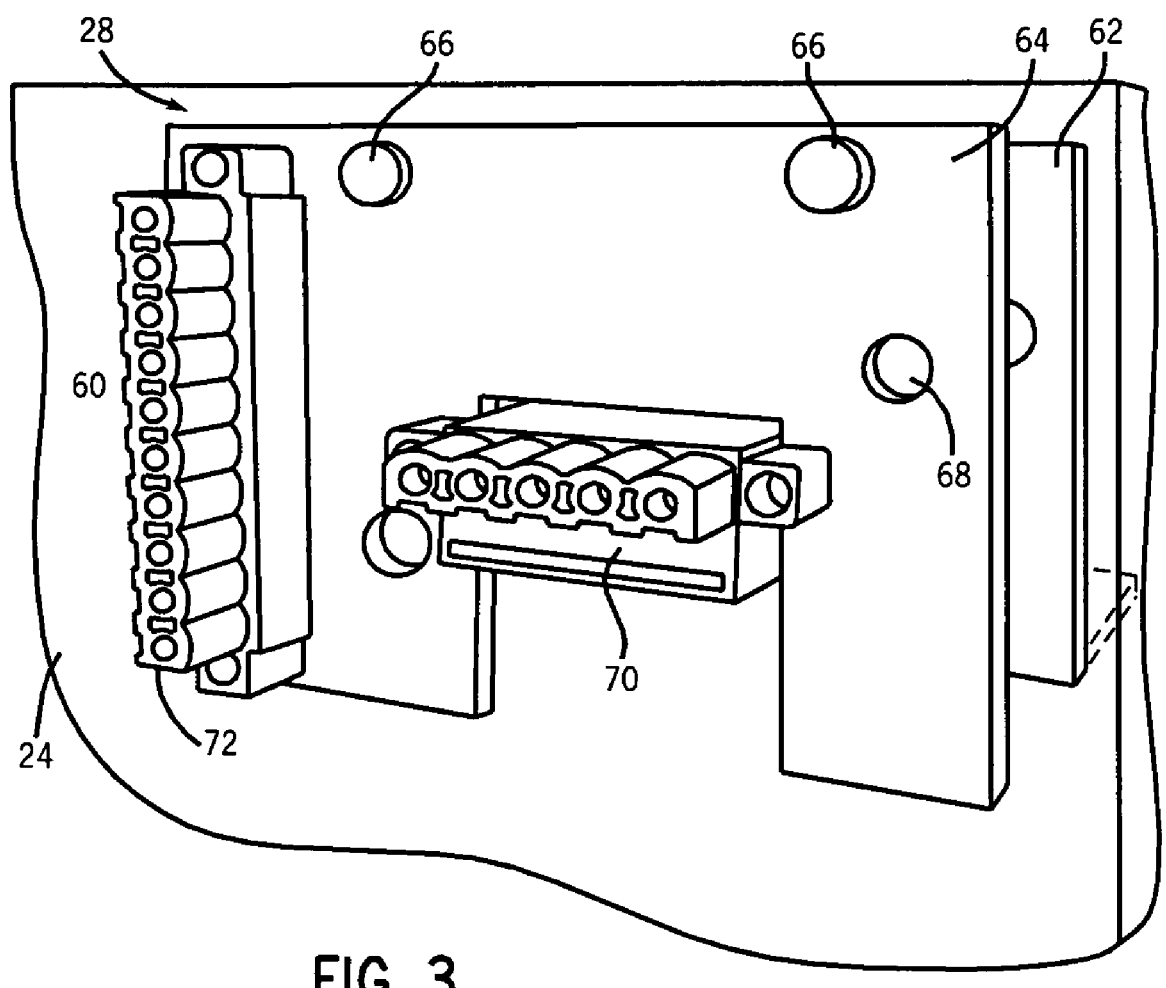
FIG. 3 is a detailed perspective view of a component connector assembly installed on a rear panel of a component support.

FIG. 3 illustrates an exemplary component connector assembly 28 of the type that can be interfaced with the prewired connector assembly 50 of FIG. 2. In the particular implementation illustrated in FIG. 3, the component connector assembly 28 is mounted on a rear panel or wall 60 of the component support 24. A fixed base plate 62 is firmly secured to the rear wall, and connected to a connector support plate 64 that is moveable with respect to the base plate. Control or disengagement members 66 extend through the base plate 62 and are fixed (e.g., threaded) to the connector support plate 64 to force disengagement of the connectors as described in greater detail below. The plates include apertures or recesses 68 to accommodate the alignment pins 58 (see, FIG. 2) of the mating network connector to facilitate alignment of the connectors during engagement.

In the embodiment illustrated in FIG. 3, a pair of separate connectors are supported on the connector support plate 64. These include a network connector 70 designed to mate with the mating network connector 54 shown in FIG. 2. Plate 64 also supports a control power connector 72 specifically designed to mate with connector 56 shown in FIG. 2.

Figure 4:
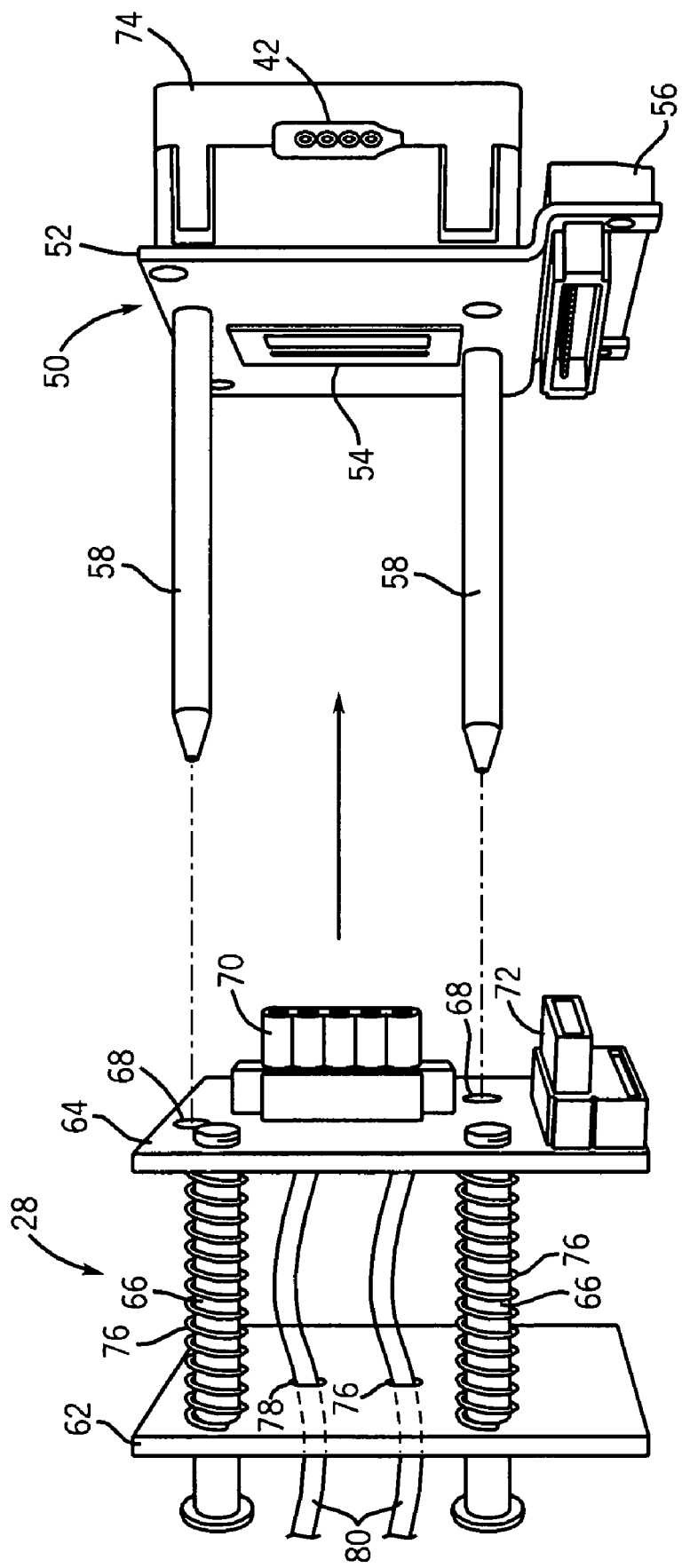
FIG. 4 is side perspective view of the connector assemblies of FIGS. 2 and 3 prior to mating.

The connectors supported on the network and control power wireway and on the component support mate as illustrated in FIG. 4. As shown in FIG. 4, the prewired connector assembly 50 generally includes a network connector body 74 the connector face of which is the mating network connector 54. In the illustrated embodiment, the network connector body 74 makes contact with conductors in the network cable 42 via insulation displacement ("vampire") pins (not shown). Other termination arrangements may, of course, be used.

On the left-hand side of FIG. 4, the component connector assembly 28 is illustrated, removed from the component support for the sake of clarity. The connector assembly 28 includes both the network connector 70 and the control power connector 72 that are coupled to wiring or cables 80 that extend through apertures 76 and 78 in the base plate 62. Similar apertures will be provided in the rear panel of the component support to permit the passage of the cables 80. The connector support plate 64 with connectors 70 and 72 supported thereon is held in a biased position by compression springs 76 that are disposed on and around the control rods or pins 66. The control rods are slidable through apertures in the base plate 62 (and similar apertures in the rear panel of the component support) to allow compression of the springs 76. Thus, the springs hold the connector support plate 64 in a normal or operative position, but the combination of the springs and of the control rods 66 allow for movement of the connector support plate (and connectors 70 and 72) with respect to the rear panel of the component support.

Figure 5:
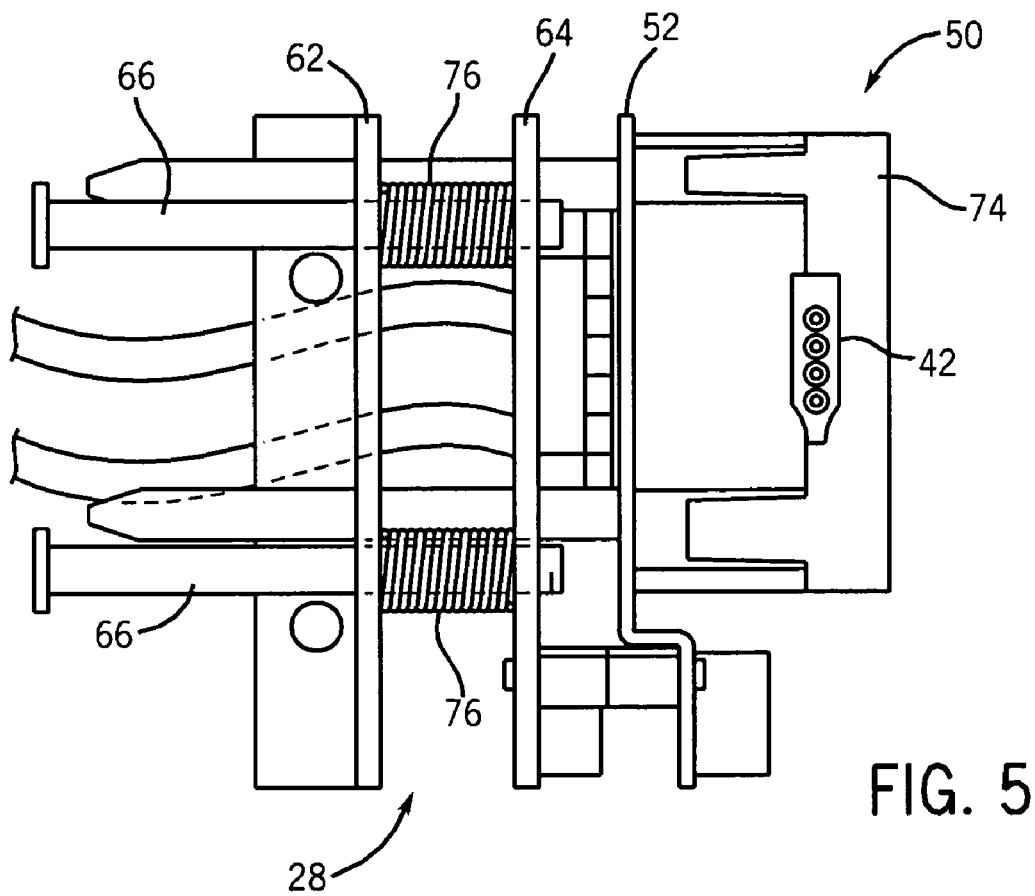
FIG. 5 is a similar side view of the connector assemblies at the point of full engagement of the component support within the enclosure to force mating of the connector assemblies.

FIG. 5 illustrates the configuration of the connectors at the time of installation and full engagement of a component support. As can be seen in FIG. 5, the springs 76 are compressed around the control rods 66, which are allowed to extend rearwardly through the base plate 62. The cables connected to connectors 70 and 72 are also free to move through the base plate. When the springs are completely compressed, a force will be exerted on the connectors 70 and 72 to cause them to engage the respective connectors 54 and 56 of the prewired connector assembly. Thereafter, the components within the component support will be supplied with network signals and control power via the mated connector assemblies.

Figure 6:
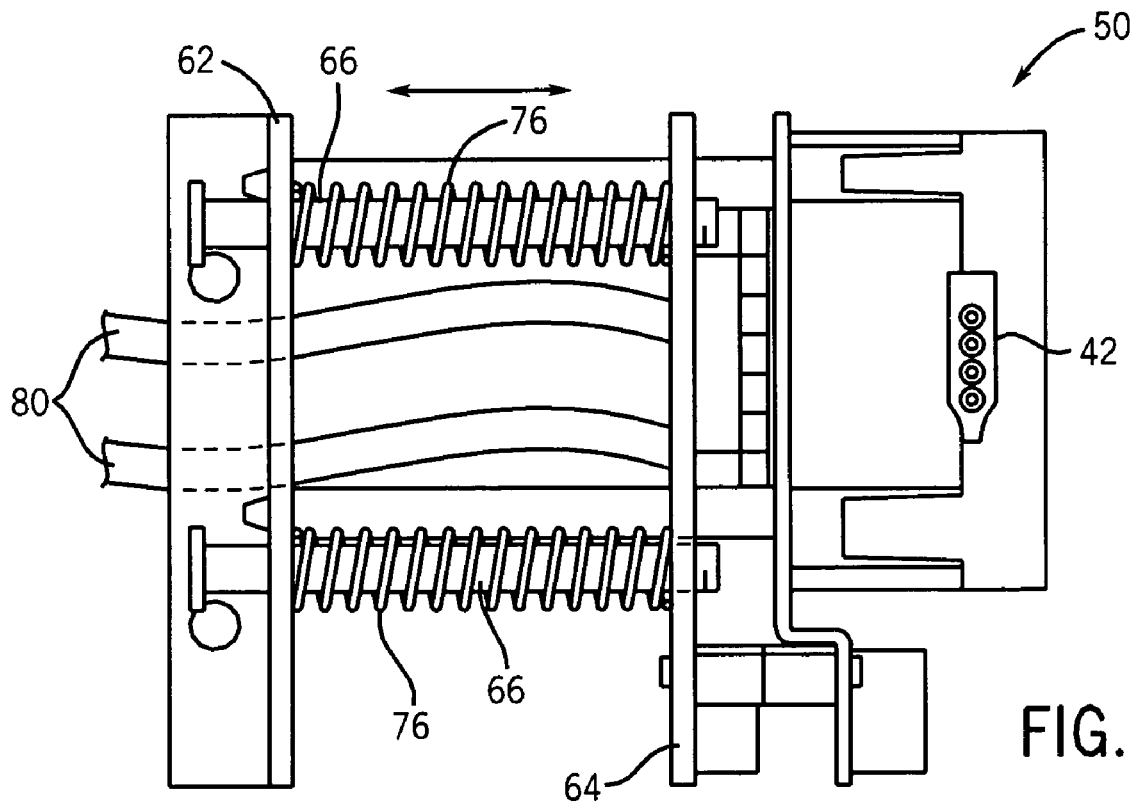
FIG. 6 is a similar side perspective view of the connector assemblies positioned at a limit of the range of movement of the component connector assembly with respect to the prewired connector assembly.

FIG. 6 illustrates the mated connector assemblies in a retracted position of the component support (not shown in FIG. 6 for the sake of clarity). Again, the base plate 62 of the component connector assembly is secured to the component support such that as the component support is partially withdrawn from the enclosure, the base plate 62 slides with respect to the control rods 66. At a maximum point of withdrawal, effectively the limit of the range provided by the length of control rods 66, the base plate 62 will contact the heads of the control rods 66 and force disengagement of the connectors from one another. The range of movement provided in the component connector assembly 28 will depend essentially upon the distance desired for uncoupling main power from the component support (via withdrawal of stabs from power buses).

As will be noted by those skilled in the art, once the connector assembly is described above are mated, contact between the connector assemblies is static. That is, no sliding contact takes place during either operation or during partial withdrawal for servicing of the component support from the enclosure. It has been found that such non-sliding contact between the connectors facilitates good signal transmission and avoids problems with signal degradation present in conventional sliding contacts for such applications.

Figure 7:
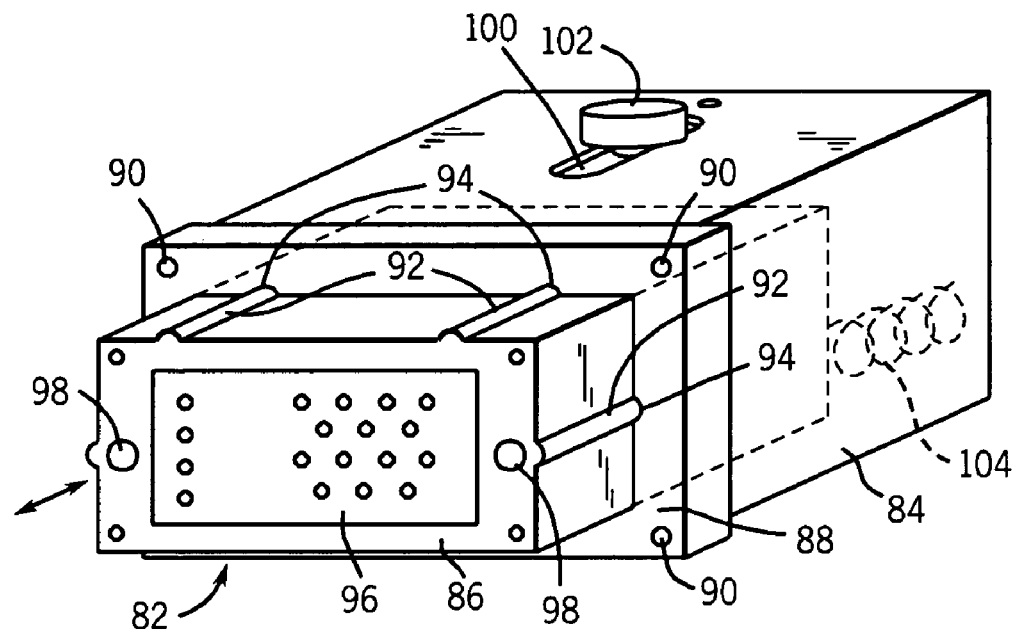
FIG. 7 is a perspective view of an alternative connector configuration for use in a component support including a single connector assembly.
Figure 8:
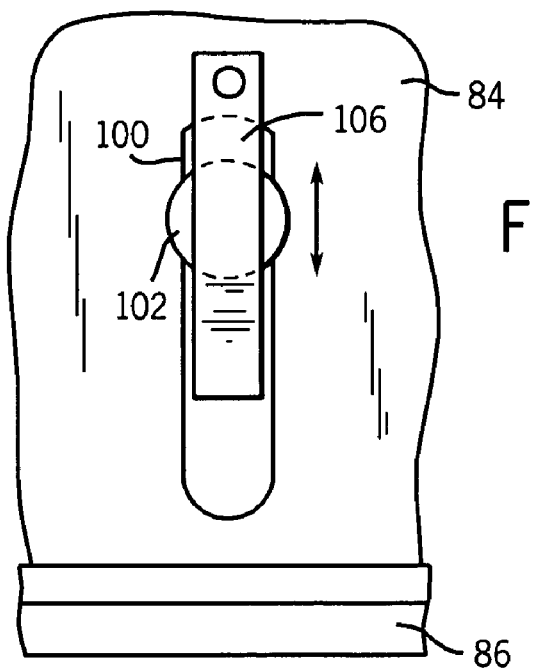
FIG. 8 is a partial top view of the connector arrangement of FIG. 7.
Figure 9:
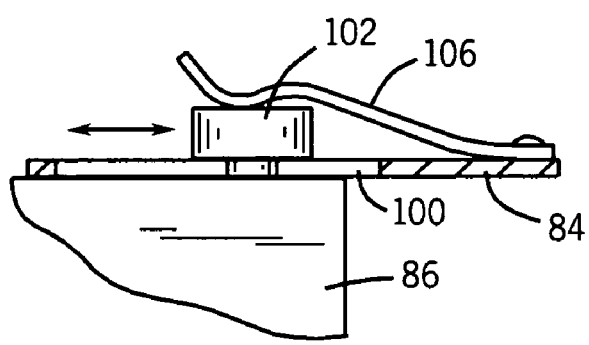
FIG. 9 is a partial side view of the connector arrangement of FIG. 8.

The foregoing arrangement allows for coupling of a component support to a connector for control power and network signals within a separated wireway using a connector assembly including more than one connector. An alternative configuration including a single connector is illustrated in FIG. 7. Although may such arrangements may be envisaged, the alternative connector assembly 82 of FIG. 7 includes a stationary part 84 designed to be affixed to the rear panel of a component support, and a movable part 86. The stationary part 84 has a flange 88 with fastener holes 90 designed to receive fasteners for fixing the stationary part on the rear panel (not shown in FIG. 7) of a component support. Guides 92 are formed on the movable part 86 to aid in guiding the movable part as it is slid within the stationary part. The guides 92 interface with recesses 94 for this purpose. The movable part 86 comprises a multi-pin plug 96 including either male, female or both types of engagement members for transmitting data signals to and from components within the component support, and for transmitting control power to the components. In the embodiment illustrated in FIG. 7, fore and aft movement of the movable part 86 is limited by a travel-limiting slot 100 in which a stop bolt 102 is positioned. The stop bolt 102 may be a shoulder fastener, for example, that is fitted to the movable part 86 through slot 100. Within the assembly, one or more biasing springs, indicated generally by reference numeral 104, serve to urge the movable part towards the operative or engaged position.

Where desired, an additional biasing member represented in FIGS. 8 and 9 may be included for interfacing with the movable part 86. In the illustrated embodiment, a spring member 106 is provided that has a contour designed to interface with the head of the stop bolt 102. That is, in either the fully or near-fully retracted position or the fully or near-fully extended position, the spring member 106 generally causes a biasing force to be applied to the movable part 86 that can be overcome to allow the movable part to be slid into or out of the stationary part 84.

Figure 10:
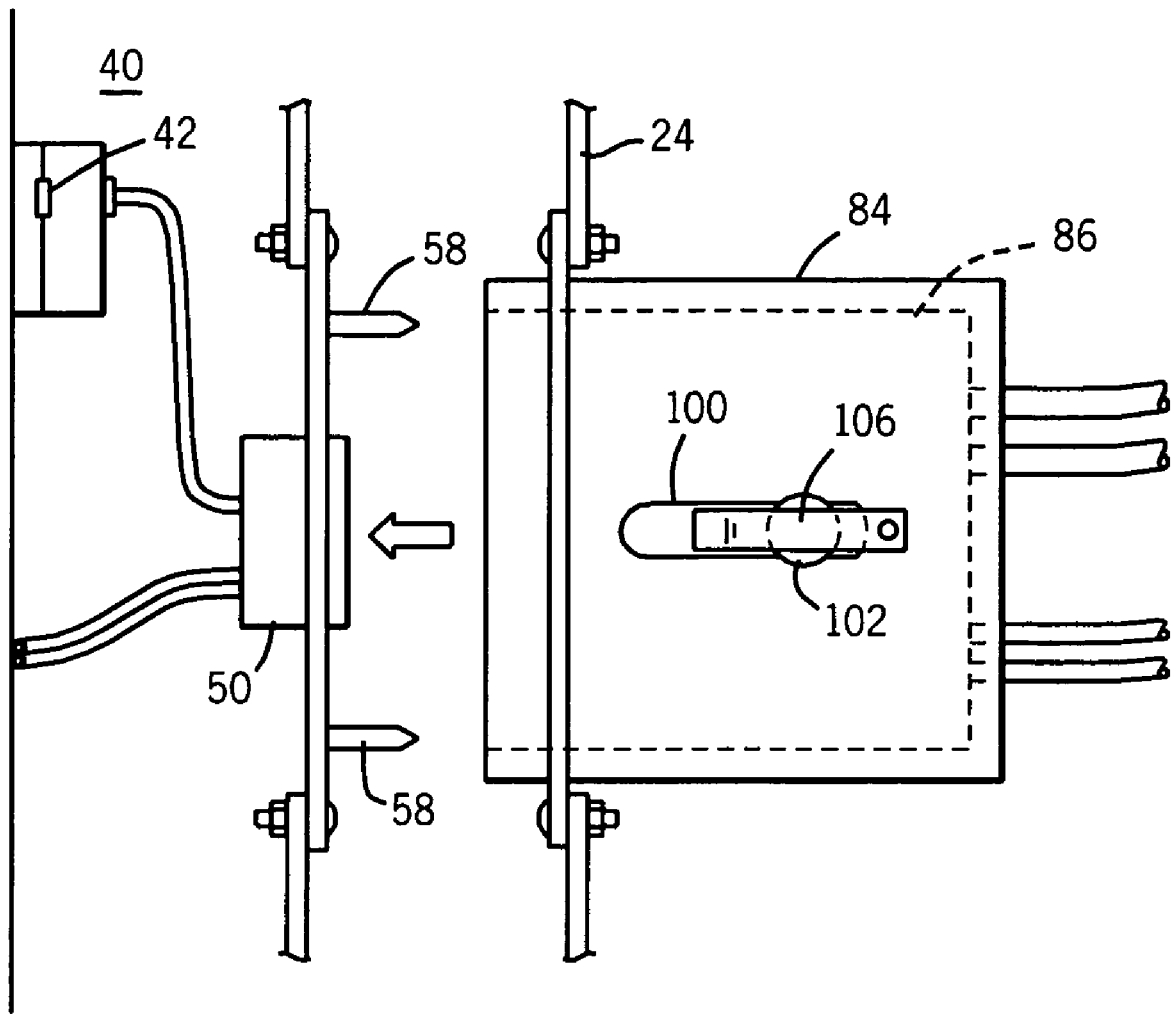
FIG. 10 is a partial top view of the connector of FIG. 7 aligned for mating with a connector in a power, in a network and control power wireway.

FIG. 10 illustrates the alternative arrangement immediately prior to making of the connections. As shown in FIG. 10, the movable part 86 of the alternative connector assembly 82 will generally be recessed within the stationary part 84. The stationary part 84 is, as noted above, secured to the rear panel of a component support as indicated by reference numeral 24. In the stop bolt arrangement of the illustrated embodiment, the bolt will bear against a rear surface of the travel-limiting slot 100. As the connector assembly approaches the prewired connector assembly 50 provided within the network and control power wireway 40, alignment pins 58 engage corresponding holes 98 (see FIG. 7) to align the connectors with one another. Further engagement of the component support within the enclosure, then, causes the connectors to be mated. Thereafter, partial retraction of the component support is possible while maintaining a static (non-sliding) connection between the mated connectors. The degree to which the component support can be withdrawn from the enclosure is, in the illustrated embodiment, defined by the length of the travel-limiting slot 100.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor control center comprising:
    an enclosure for housing a plurality of electrical power component supports;
    a network and control power wireway within the enclosure and configured to house only conductors for a network link to the component supports and conductors for control power from a power source; and
    a power wireway within the enclosure and separated from the network and control power wireway for housing three phase power conductors;
    whereby the network link conductors and the control power conductors can be accessed independently of the three phase conductors.

2. The system of claim 1, wherein the network and control power wireway is disposed along a rear portion of the enclosure.

3. The system of claim 1, wherein the network and control power wireway receives a plurality of prewired connector assemblies for plug-in engagement of component supports within the enclosure.

4. The system of claim 1, wherein the control power conductors, in operation, carry 110, 115, 220 or 230 volt, single phase power.

5. The system of claim 1, wherein the control power conductors, in operation carry 24 volt direct current or single phase power.

6. The system of claim 1, wherein the network and control power wireway is disposed within a main interior volume of the enclosure accessible via at least one main door, and the power wireway is disposed adjacent to the main interior volume of the enclosure and accessible via a separate door.

7. The system of claim 1, wherein network and control power wireway is disposed adjacent to an upper wireway, the upper wireway housing a trunk network cable, and the network and control power wireway housing a drop network cable coupled to the trunk network cable.

8. A motor control center comprising:
an enclosure for housing a plurality of electrical power component supports in a main interior volume thereof;
a network and control power wireway disposed within a main interior volume of the enclosure accessible via at least one main door, the network and control power wireway configured to house only conductors for a network link to the component supports and conductors for control power from a power source; and
a power wireway within the enclosure adjacent to the main interior volume and accessible via a separate door and separated from the network and control power wireway for housing three phase power conductors;
whereby the network link conductors and the control power conductors can be accessed independently of the three phase conductors.

9. The system of claim 8, wherein the network and control power wireway is disposed along a rear portion of the enclosure.

10. The system of claim 8, wherein the network and control power wireway receives a plurality of prewired connector assemblies for plug-in engagement of component supports within the enclosure.

11. The system of claim 8, wherein the control power conductors, in operation, carry 110, 115, 220 or 230 volt, single phase power.

12. The system of claim 8, wherein the control power conductors, in operation, carry 24 volt direct current or single phase power.

13. The system of claim 8, wherein network and control power wireway is disposed adjacent to an upper wireway, the upper wireway housing a trunk network cable, and the network and control power wireway housing a drop network cable coupled to the trunk network cable.

14. A motor control center comprising:
an enclosure for housing a plurality of electrical power component supports in a main interior volume thereof;
a network and control power wireway disposed within a main interior volume of the enclosure accessible via at least one main door, the network and control power wireway configured to house only conductors for a network link to the component supports and conductors for control power from a power source;
a plurality of prewired connector assemblies disposed over the network and power wireway for plug-in engagement of component supports within the enclosure; and
a power wireway within the enclosure adjacent to the main interior volume and accessible via a separate door;
whereby the network link conductors and the control power conductors can be accessed independently of the three phase conductors.

15. The system of claim 14, wherein the network and control power wireway is disposed along a rear portion of the enclosure.

16. The system of claim 14, wherein the control power conductors, in operation, carry 110, 115, 220 or 230 volt, single phase power.

17. The system of claim 14, wherein the control power conductors, in operation carry 24 volt direct current or single phase power.

18. The system of claim 14, wherein network and control power wireway is disposed adjacent to an upper wireway, the upper wireway housing a trunk network cable, and the network and control power wireway housing a drop network cable coupled to the trunk network cable.

19. The system of claim 14, wherein the connector assemblies are configured to mate with connectors of the component supports when the component supports are fully engaged in the enclosure.

20. The system of claim 14, wherein each of the connector assemblies includes separate network and control power connectors.

* * * * *